United States Patent
Choi et al.

(10) Patent No.: US 9,735,211 B2
(45) Date of Patent: Aug. 15, 2017

(54) ORGANIC LIGHT EMITTING DIODE DISPLAY DEVICE HAVING IMPROVED APERTURE RATIO AND LIFETIME

(71) Applicant: LG DISPLAY CO., LTD., Seoul (KR)

(72) Inventors: Dae-Jung Choi, Paju-si (KR); Jae-Ki Lee, Paju-si (KR); Ki-Soub Yang, Paju-si (KR); Hwang-Un Seo, Paju-si (KR); Hong-Myeong Jeon, Goyang-si (KR); Seung-Ryul Choi, Goyang-si (KR); A-Ryoung Lee, Seoul (KR); Han-Hee Kim, Anseong-si (KR); Geum-Young Lee, Incheon (KR); Kang-Hyun Kim, Gyeongju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/643,714

(22) Filed: Mar. 10, 2015

(65) Prior Publication Data
US 2015/0249117 A1    Sep. 3, 2015

Related U.S. Application Data

(62) Division of application No. 14/012,321, filed on Aug. 28, 2013, now Pat. No. 9,318,542.

(30) Foreign Application Priority Data

Nov. 26, 2012 (KR) .................. 10-2012-0134299

(51) Int. Cl.
*H01L 27/32* (2006.01)
*H01L 51/50* (2006.01)

(52) U.S. Cl.
CPC ...... *H01L 27/3246* (2013.01); *H01L 27/3248* (2013.01); *H01L 27/3262* (2013.01); *H01L 51/5012* (2013.01)

(58) Field of Classification Search
CPC . H01L 51/0005; H01L 51/5265; H01L 51/56; H01L 27/3246
(Continued)

(56) References Cited

U.S. PATENT DOCUMENTS 8,029,850 B2   10/2011  Ishii
2003/0137242 A1*  7/2003  Seki .................. H01L 27/3246
                                                 313/506
(Continued)

FOREIGN PATENT DOCUMENTS

CN          1841703 A     10/2006

OTHER PUBLICATIONS

Office Action dated Dec. 4, 2015 for corresponding Chinese Patent Application No. 201310356202.5, 11 pages.
(Continued)

*Primary Examiner* — Evan Pert
*Assistant Examiner* — Changhyun Yi
(74) *Attorney, Agent, or Firm* — Brinks, Gilson & Lione

(57) ABSTRACT

An organic light emitting diode display device includes a substrate including a display region, wherein a plurality of pixel regions are defined in the display region; a first electrode over the substrate and in each of the plurality of pixel regions; a bank including a lower layer and an upper layer on the first electrode, the lower layer disposed on edges of the first electrode and having a first width and a first thickness, the upper layer disposed on the lower layer and having a second width smaller than the first width; an organic emitting layer on the first electrode and a portion of the lower layer; and a second electrode on the organic emitting layer and covering an entire surface of the display region.

14 Claims, 25 Drawing Sheets

(58) Field of Classification Search
USPC .................. 257/40, 88, 98; 313/503, 504
See application file for complete search history.

(56) References Cited

U.S. PATENT DOCUMENTS

| | | | |
|---|---|---|---|
| 2005/0073249 A1* | 4/2005 | Morii | H01L 51/5012 |
| | | | 313/504 |
| 2008/0063949 A1* | 3/2008 | Inoue | H01L 27/3246 |
| | | | 430/5 |
| 2013/0038203 A1* | 2/2013 | Kim | 313/504 |
| 2014/0147950 A1 | 5/2014 | Choi et al. | |

OTHER PUBLICATIONS

Search Report dated Nov. 25, 2015 for corresponding Chinese Patent Application No. 201310356202.5, 4 pages.

* cited by examiner

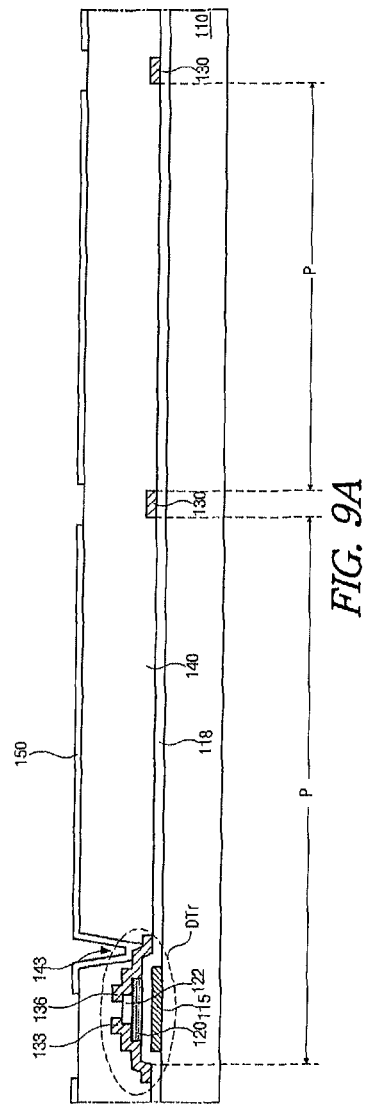

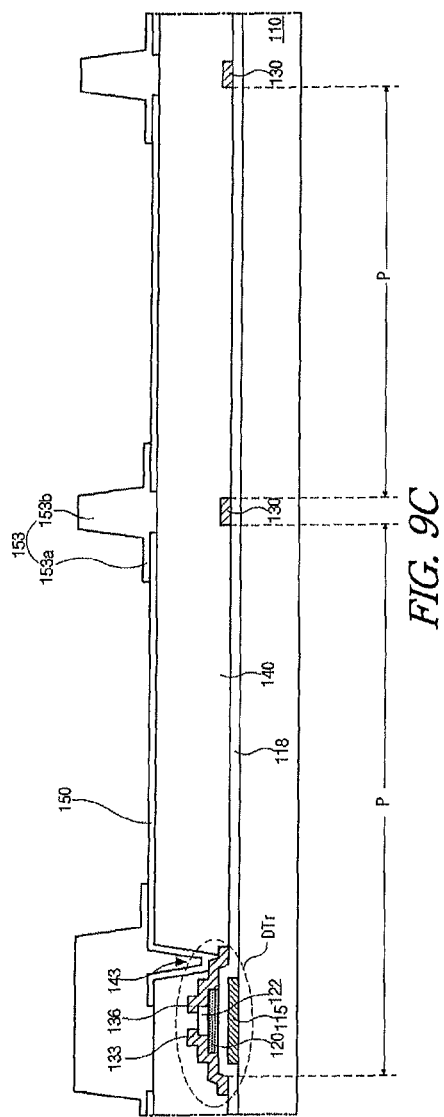

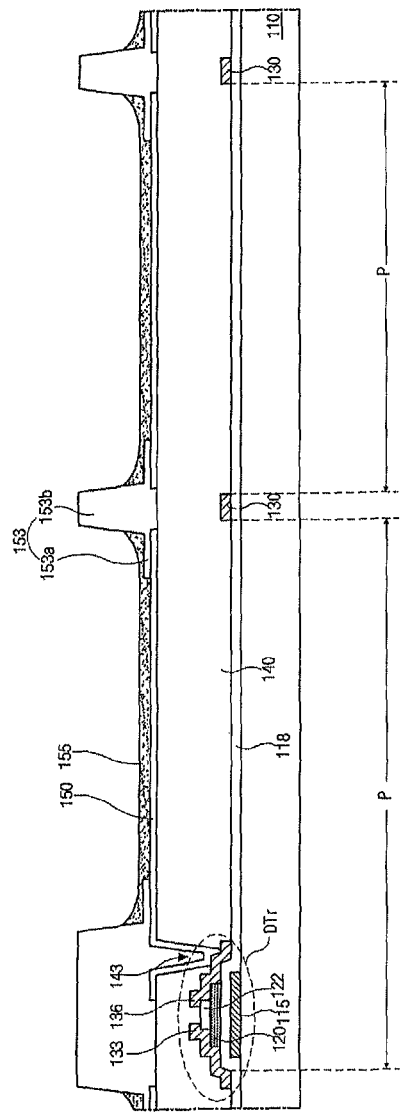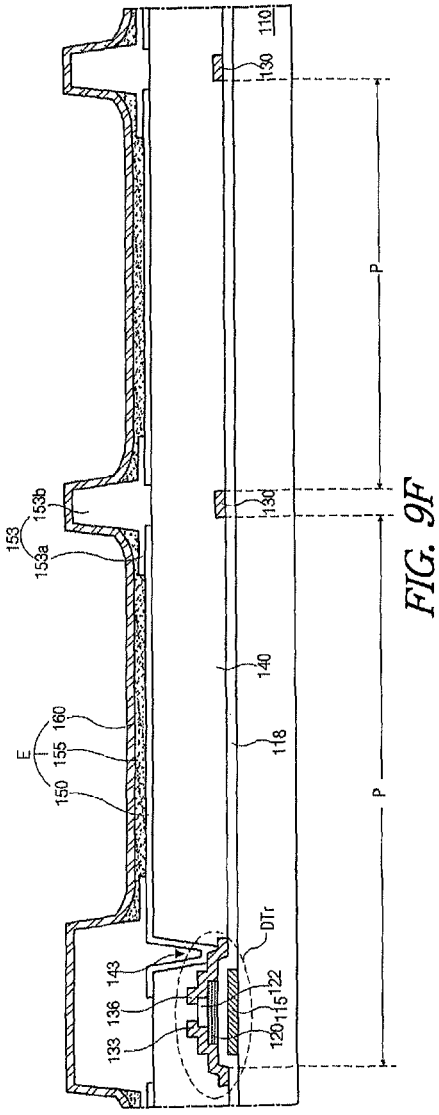

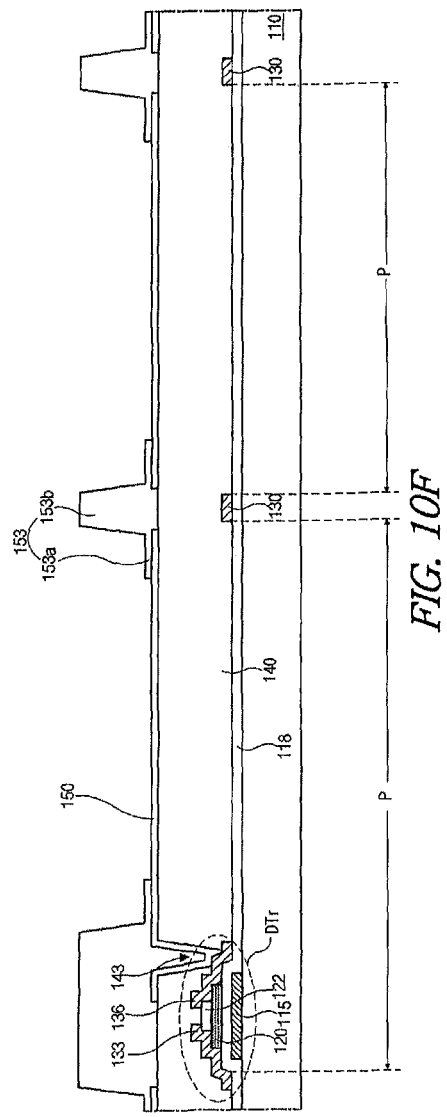

ORGANIC LIGHT EMITTING DIODE DISPLAY DEVICE HAVING IMPROVED APERTURE RATIO AND LIFETIME

The present application claims priority to and is a divisional application of U.S. patent application Ser. No. 14/012,321, filed on Aug. 28, 2013, which claims the benefit of Korean Patent Application No. 10-2012-0134299 filed in Korea on Nov. 26, 2012, which is hereby incorporated by reference for all purposes as if fully set forth herein.

BACKGROUND

Field of the Disclosure

The disclosure relates to an organic light emitting diode (OLED) display device, which may be referred to as an organic electroluminescent display device, and more particularly, to an OLED display device having improved aperture ratio and lifetime.

Discussion of the Related Art

An OLED display device of new flat panel display devices has high brightness and low driving voltage. The OLED display device is a self-emitting type and has excellent view angle characteristics, contrast ratio, a response time, etc.

Accordingly, the OLED display device is widely used for a television, a monitor, a mobile phone, etc.

The OLED display device includes an array element and an organic light emitting diode. The array element includes a switching thin film transistor (TFT), which is connected to a gate line and a data line, a driving TFT, which is connected to the switching TFT, and a power line, which is connected to the driving TFT. The organic light emitting diode includes a first electrode, which is connected to the driving TFT, and further includes an organic emitting layer and a second electrode.

In the OLED display device, light from the organic emitting layer passes through the first electrode or the second electrode to display an image. A top emission type OLED display device, where the light passes through the second electrode, has an advantage in an aperture ratio.

Generally, the organic emitting layer is formed by a thermal deposition method using a shadow mask. However, the shadow mask sags because the shadow mask becomes larger with an increase in sizes of display devices. As a result, there is a problem in deposition uniformity in the larger display device. In addition, since a shadow effect is generated in the thermal deposition method using the shadow mask, it is very difficult to fabricate a high resolution OLED display device, e.g., above 250 PPI (pixels per inch).

Accordingly, a new method instead of the thermal deposition method using the shadow mask has been introduced.

In the new method, a liquid phase organic emitting material is sprayed or dropped in a region surrounded by a wall using an ink-jet apparatus or a nozzle-coating apparatus and cured to form the organic emitting layer.

FIG. 1 is a schematic cross-sectional view showing an OLED display device in a step of forming an organic emitting layer by spraying or dropping a liquid phase organic emitting material.

To spray or drop the liquid phase organic emitting material by the ink jet apparatus or the nozzle-coating apparatus, a bank 53, which is formed on the first electrode 50 and surrounds a pixel region P, is required to prevent the liquid phase organic emitting material from flooding into a next pixel region P. Accordingly, as shown in FIG. 1, the bank 53 is formed on edges of the first electrode 50 before forming the organic emitting layer 55.

The bank 53 is formed of an organic material having a hydrophobic property. The hydrophobic bank 53 prevents the organic emitting material, which has a hydrophilic property, from being formed on the bank 53 and flooding into a next pixel region P.

By spraying or dropping the liquid phase organic emitting material from a head of the ink-jet apparatus or a nozzle of the nozzle-coating apparatus into the pixel region P, which is surrounded by the bank 53, the pixel region P is filled with the organic emitting material. The organic emitting material is dried and cured by heat to form the organic emitting layer 55.

However, the organic emitting layer 55 has a difference in a thickness. Namely, the organic emitting layer 55 has a thickness in edges being larger than a thickness in a center.

If the organic emitting layer 55 has a thickness difference, the OLED display device has a difference in emitting efficiency. Accordingly, as shown in FIG. 2, which is a picture showing one pixel region in the related art OLED display device, dark images are displayed in edges of the pixel region. In this instance, since the dark images are perceived as an image defect by the viewer, the edges of the pixel region should be shielded such that the edges of the pixel region do not serve as an effective emission area.

Referring again to FIG. 1, an effective emission area EA1 is a portion of the pixel region P where the organic emitting layer 55 has a flat top surface. Namely, the aperture ratio of the OLED display device is decreased.

SUMMARY

A method of fabricating an organic light emitting diode display device includes forming a first electrode over a substrate including a display region, which includes a plurality of pixel regions, the first electrode formed in each of the plurality of pixel regions; forming a bank including a lower layer and an upper layer, the lower layer formed on edges of the first electrode and having a first width and a first thickness, and the upper layer formed on the lower layer and having a second width smaller than the first width; forming an organic emitting layer on the first electrode and a portion of the lower layer; and forming a second electrode on the organic emitting layer, the second electrode covering an entire surface of the display region.

In another aspect, an organic light emitting diode display device includes a substrate including a display region, wherein a plurality of pixel regions are defined in the display region; a first electrode over the substrate and in each of the plurality of pixel regions; a bank including a lower layer and an upper layer on the first electrode, the lower layer disposed on edges of the first electrode and having a first width and a first thickness, the upper layer disposed on the lower layer and having a second width smaller than the first width; an organic emitting layer on the first electrode and a portion of the lower layer; and a second electrode on the organic emitting layer and covering an entire surface of the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 9A to 9G are cross-sectional views showing a fabricating process of an OLED display device according to a first embodiment of the present invention.

FIGS. 10A to 10F are cross-sectional views showing a fabricating process of on OLED display device according to another example of the first embodiment of the present invention.

DETAILED DESCRIPTION

Reference will now be made in detail to the preferred embodiments, examples of which are illustrated in the accompanying drawings.

Figure 3:
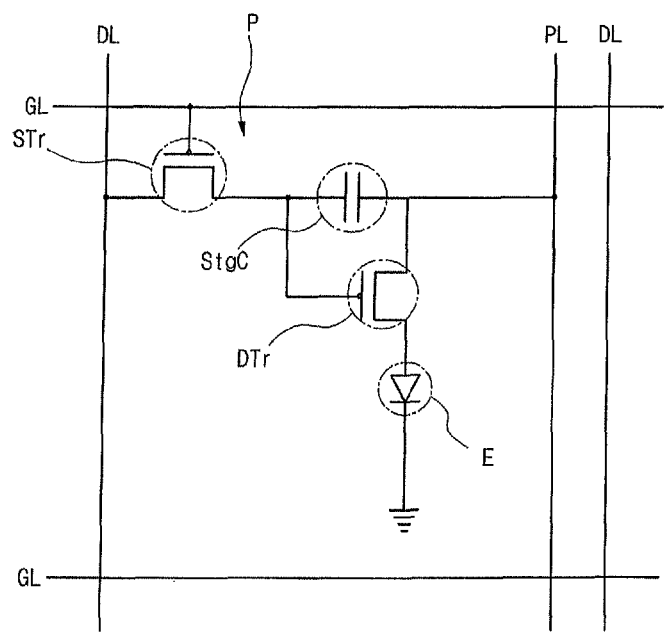
FIG. 3 is a circuit diagram of one pixel region of an OEM device.

FIG. 3 is a circuit diagram of one pixel region of an OLED device.

As shown in FIG. 3, an OLED display device includes a switching thin film transistor (TFT) STr, a driving TFT DTr, a storage capacitor StgC and an emitting diode E in each pixel region P.

On a substrate (not shown), a gate line GL along a first direction and a data line DL along a second direction are formed. The gate line GL and the data line DL cross each other to define the pixel region P. A power line PL for providing a source voltage to the emitting diode E is formed to be parallel to and spaced apart from the data line DL.

The switching TFT STr is connected to the gate and data lines GL and DL, and the driving TFT DTr and the storage capacitor StgC are connected to the switching TFT STr and the power line PL. The emitting diode E is connected to the driving TFT DTr.

A first electrode of the emitting diode E is connected to a drain electrode of the driving TFT DTr, and a second electrode of the emitting diode E is grounded.

When the switching TFT STr is turned on by a gate signal applied through the gate line GL, a data signal from the data line DL is applied to the gate electrode of the driving TFT DTr and an electrode of the storage capacitor StgC. When the driving TFT DTr is turned on by the data signal, an electric current is supplied to the emitting diode E from the power line PL. As a result, the emitting diode E emits light. In this case, when the driving TFT DTr is turned on, a level of an electric current applied from the power line PL to the emitting diode E is determined such that the emitting diode E can produce a gray scale. The storage capacitor StgC serves to maintain the voltage of the gate electrode of the driving TFT DTr when the switching TFT STr is turned off. Accordingly, even if the switching TFT STr is turned off, a level of an electric current applied from the power line PL to the emitting diode E is maintained to a next frame.

Figure 4:
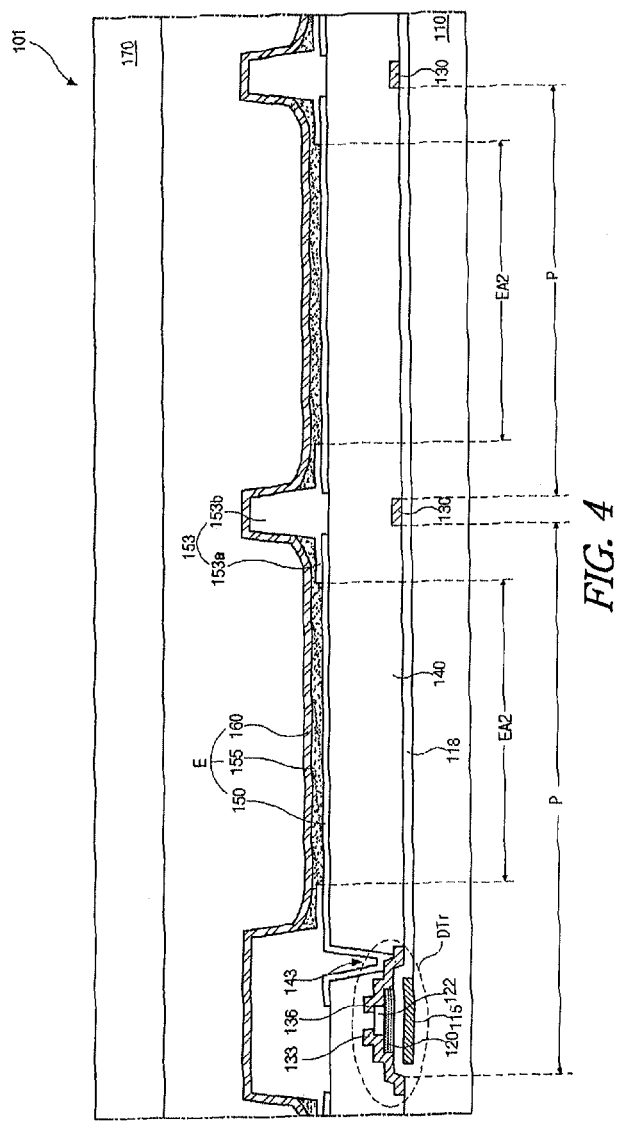
FIG. 4 is a schematic cross-sectional view of an OLED display device according to an embodiment of the present invention.

FIG. 4 is a schematic cross-sectional view of an OLED display device according to an embodiment of the present invention. FIG. 4 shows one driving TFT DTr in one pixel region P. However, the driving TFT DTr is formed in each pixel region P.

As shown in FIG. 4, an OLED display device 101 of the present invention includes a first substrate 110, where a driving TFT DTr, a switching TFT (not shown) and an organic emitting diode E are formed, and a second substrate 170 for encapsulation. The second substrate 170 may be an inorganic insulating film or an organic insulating film.

A gate line (not shown) and a data line 130 are formed on the first substrate 110. The gate line and the data line 130 cross each other to define the pixel region P. A power line (not shown) for providing a voltage to the emitting diode E is formed to be parallel to and spaced apart from the data line 130.

In each pixel region P, the switching TFT is connected to the gate line and the data line 130, and the driving TFT DTr and the storage capacitor StgC are connected to the switching TFT and the power line.

The driving TFT DTr includes a gate electrode 115, a gate insulating layer 118, an oxide semiconductor layer 120, an etch-stopper 122, a source electrode 133 and a drain electrode 136. The gate insulating layer 118 covers the gate electrode 115, and the oxide semiconductor layer 120 is disposed on the gate insulating layer 118. The oxide semiconductor layer 120 corresponds to the gate electrode 115. The etch-stopper 122 covers a center of the oxide semiconductor layer 120. The source electrode 133 and the drain electrode 136 are disposed on the etch-stopper 122 and spaced apart from each other. The source electrode 133 and the drain electrode 136 contact both ends of the oxide semiconductor layer 120, respectively. Although not shown, the switching TFT has substantially the same structure as the driving TFT DTr.

Figure 5:
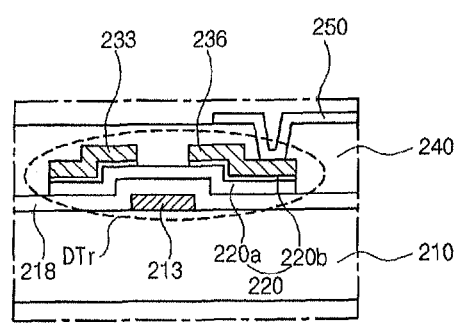
FIG. 5 is a schematic cross-sectional view of an OLED display device according to one modified embodiment of the present invention.

In FIG. 4, each of the driving TFT DTr and the switching TFT includes the oxide semiconductor layer 120 of an oxide semiconductor material. Alternatively, as shown in FIG. 5, each of the driving TFT DTr and the switching TFT may include a gate electrode 213, a gate insulating layer 218, a semiconductor layer 220 including an active layer 220a of intrinsic amorphous silicon and an ohmic contact layer 220b of impurity-doped amorphous silicon, a source electrode 233 and a drain electrode 236.

Figure 6:
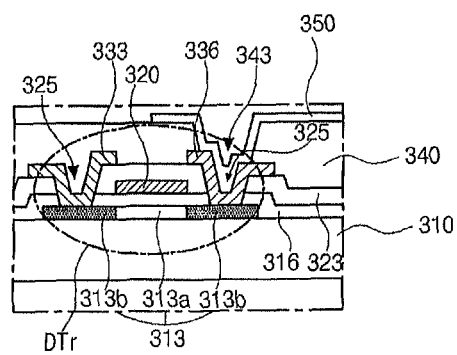
FIG. 6 is a schematic cross-sectional view of an OLED display device according to another modified embodiment of the present invention.

Meanwhile, each of the driving TFT DTr and the switching TFT may have a top gate structure where the semiconductor layer is positioned at a lowest layer. Namely, as shown in FIG. 6, each of the driving TFT DTr and the switching TFT may include a semiconductor layer 313, which includes an active region 313a of intrinsic polysilicon and impurity-doped regions 313b at both sides of the active region 313a, on a first substrate 310, a gate insulating layer 316, a gate electrode 320 corresponding to the active region 313a of the semiconductor layer 313, an interlayer insulating layer 323 having semiconductor contact holes 325, which expose the impurity-doped regions 313b of the semiconductor layer 313, and source and drain electrodes 333 and 336 respectively connected to the impurity-doped regions 313b through the semiconductor contact holes 325.

The top gate structure TFT requires the interlayer insulating layer 323 in comparison to a bottom gate structure TFT. In the top gate structure TFT, the gate line (not shown) is formed on the gate insulating layer 316, and the data line (not shown) is formed on the interlayer insulating layer 323.

Referring again to FIG. 4, a passivation layer 140, which includes a drain contact hole 143 exposing the drain electrode 136 of the driving TFT DTr, is formed over the driving TFT DTr and the switching TFT. For example, the passivation layer 140 may be formed of an organic insulating material, e.g., photo-acryl, to have a flat top surface.

A first electrode 150, which contacts the drain electrode 136 of the driving TFT DTr through the drain contact hole 143, is formed on the passivation layer 140 and separately in each pixel region P.

The first electrode 150 is formed of a conductive material having a relatively high work function, e.g., about 4.8 eV to 5.2 eV. For example, the first electrode 150 may be formed of a transparent conductive material such as indium-tin-oxide (ITO) to serve as an anode.

When the first electrode 150 is formed of the transparent conductive material, a reflection layer (not shown) may be formed under the first electrode 150 to increase emission efficiency in a top emission type OLED display device. For example, the reflection layer may be formed of a metallic material, such as aluminum (Al) or Al alloy such as AlNd, having a relatively high reflectivity.

With the reflection layer, the light from an organic emitting layer 155, which is formed on the first electrode 150, is reflected by the reflection layer such that the emission efficiency is increased. As a result, the OLED display device has an improved brightness property.

A bank 153 having a double-layered structure, which includes a lower layer 153a and an upper layer 153b, is formed along boundaries of the pixel region P. The lower layer 153a has a first width, and the upper layer 153b has a second width narrower than the first width. The lower layer 153a of the bank 153 is formed on edges of the first electrode 150 such that a center of the first electrode 150 is exposed by the lower layer 153a, and the upper layer 153b is disposed on the lower layer 153a. The bank 153 includes a hydrophobic material. For example, the bank 153 may be formed of an organic insulating material having a hydrophobic property or an organic insulating material containing a hydrophobic material.

At this time, a thickness of the lower layer 153a is thinner than a thickness of the organic emitting layer 155, which is formed on the lower layer 153a. The thickness of the lower layer 153a may be within a range of 0.2 micrometers to 1.5 micrometers. Additionally, the lower layer 153a is exposed outwards side surfaces of the upper layer 153b, and an exposed width of the lower layer 153a may be within a range of 1 micrometer to 9 micrometers.

Figure 1:
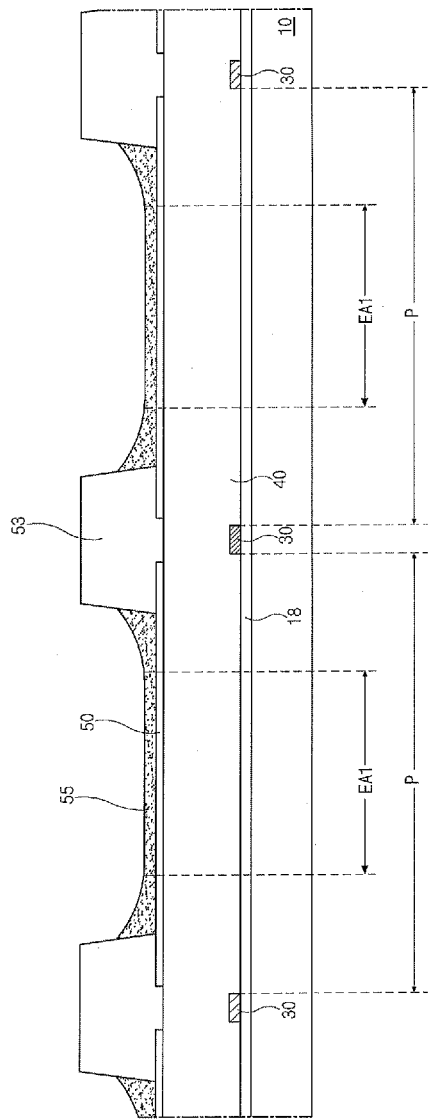
FIG. 1 is a schematic cross-sectional view showing an OLED display device in a step of forming an organic emitting layer by spraying or dropping a liquid phase organic emitting material.
Figure 2:
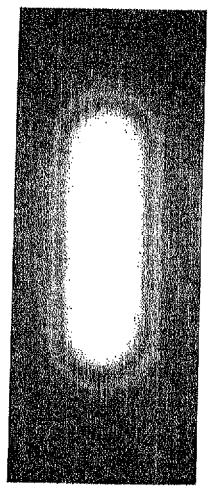
FIG. 2 is a picture showing one pixel region in the related art OLED display device.

The first width of the lower layer 153a is substantially the same as that of the bank 53 having a single-layered structure in the related art OLED display device of FIG. 1.

In the OLED display device 101 including the bank 153a of a double-layered structure, which includes the lower layer 153a having the first width and the thickness smaller than the organic emitting layer 155 and the upper layer 153b having the second width smaller than the first width, the organic emitting layer 155 is formed on the lower layer 153a of the bank 153 exposed outwards the side surfaces of the upper layer 153b, and the organic emitting material flows into a center of the pixel region P due to the lower layer 153a of the bank 153. As a result, a problem of an increase in the thickness of the organic emitting layer 155 is reduced in a region adjacent to the bank 153.

In addition, since the lower layer 153a of the bank 153 has substantially the same width as the bank 53 of FIG. 1 of the related art, a region surrounded by the upper layer 153b of the bank 153, which has the second width smaller than the first width of the lower layer 153a of the bank 153, is larger than that surrounded by the bank 53 of the related art when the pixel region has the same size in the present invention and the related art.

Moreover, since the lower layer 153a of the bank 153 has the thickness smaller than the organic emitting layer 155, the organic emitting layer 155 is formed on the lower layer 153a of the bank 153.

Furthermore, since the organic emitting layer 155 on the lower layer 153a of the bank 153 has a portion forming a substantially flat top surface with the center of the pixel region P, the flat top surface of the organic emitting layer 155 is increased in the pixel region P, and the organic emitting layer 155 has the flat top surface in a region surrounded by the lower layer 153a of the bank 153.

Accordingly, an emission area EA2, which is defined as a region of the organic emitting layer 155 having the flat top surface, is increased in comparison to the emission area EA1 of FIG. 1 in the related art OLED display device such that the OLED display device of the present invention has an improved aperture ratio.

Figure 7:
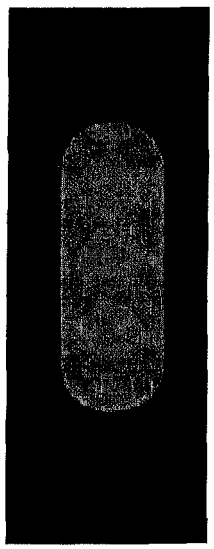
FIG. 7 is a picture showing one pixel region in an OLED display device according to the present invention.

FIG. 7 is a picture showing one pixel region in an OLED display device according to the present invention when the OLED display device is driven. Here, the OLED display device includes a bank, which has a double-layered structure including two layers of different widths, and an organic emitting layer, which is formed on the bank and formed of a liquid phase organic emitting material.

Referring to FIG. 7, the emission area EA2 of FIG. 4 in the OLED display device of the present invention is increased in comparison to the emission area EA1 of FIG. 1 in the related art OLED display device. In addition, uniformity in brightness of the OLED display device of the present invention is improved due to the organic emitting layer 155 of FIG. 4 having the flat top surface all over the emission area EA2 of FIG. 4.

Figure 8A:
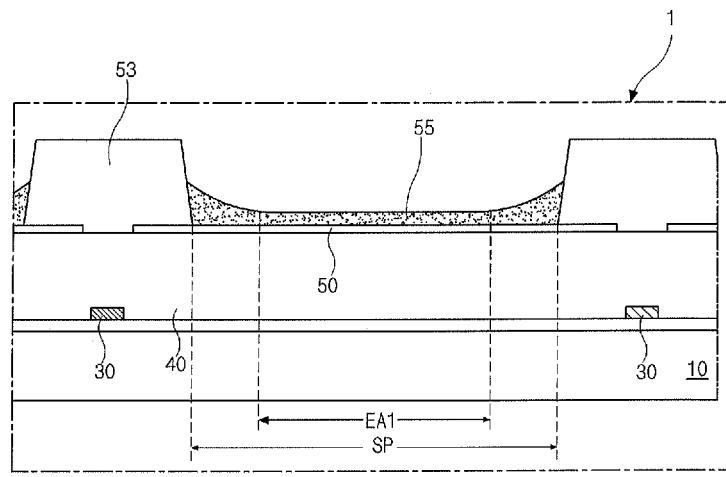
FIGS. 8A and 8B are schematic cross-sectional views explaining effective emission areas of the prior art OLED display device (see FIG. 8A) and an OLED display device according to the present invention (see FIG. 8B).
Figure 8B:
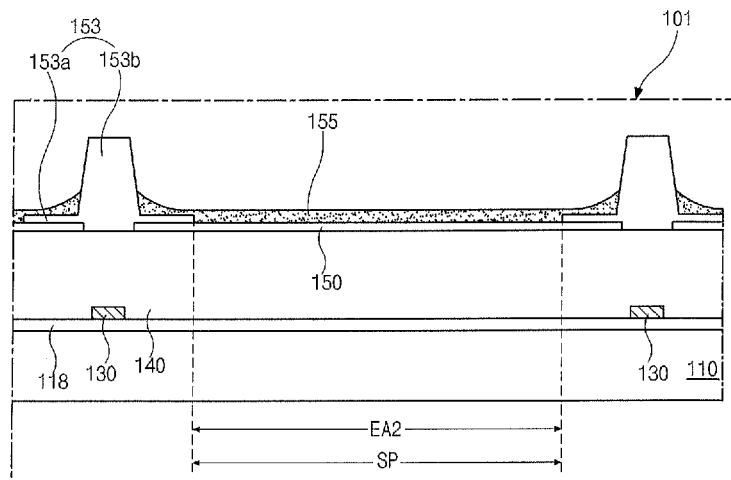

FIGS. 8A and 8B are schematic cross-sectional views explaining effective emission areas of the prior art OLED display device (see FIG. 8A) and an OLED display device according to the present invention (see FIG. 8B).

As shown in FIGS. 8A and 8B, with the pixel region of the same size defined by the gate line (not shown) and the data line 30 or 130, an effective pixel region SP is defined as a region surrounded by the bank 53 or 153. In this instance, referring to FIG. 8A, the effective pixel region SP in the prior art OLED display device is a region surrounded by the bank 53, while the effective pixel region SP in the OLED display device of the present invention is a region surrounded by the lower layer 153a of the bank 153 having the first width. The areas of the effective pixel regions SP in the prior art OLED display device and the OLED display device of the present invention are equal to each other.

However, a size of the effective emission area EA2 in the effective pixel region SP of the OLED display device of the present invention is larger than that of the effective emission area EA1 in the effective pixel region SP of the prior art OLED display device.

Since the organic emitting layer 55 of the prior art OLED display device has different thicknesses in the center and the edge of the effective pixel region SP, the effective emission area EA1 is smaller than the effective pixel region SP. However, since the organic emitting layer 155 of the OLED display device 101 according to the present invention has a uniform thickness in an entire surface of the effective pixel region SP, the effective emission area EA2 is equal to the effective pixel region SP. Namely, a size of the effective emission area EA2 in the effective pixel region SP of the OLED display device of the present invention is larger than that of the effective emission area EA1 in the effective pixel region SP of the prior art OLED display device such that the aperture ratio of the OLED display device is increased.

Referring again to FIG. 4, the organic emitting layer 155 is formed on the first electrode 150 and on the lower layer 153a of the bank 153 in an opening of the upper layer 153b of the bank 153. The organic emitting layer 155 includes red, green and blue emitting materials in respective pixel regions P.

The organic emitting layer 155 is formed by forming an organic emitting material layer and curing the organic emitting material layer. The organic emitting material layer is formed by coating, i.e., spraying or dropping a liquid phase organic emitting material by an ink-jet apparatus or a nozzle-coating apparatus.

FIG. 4 shows a single-layered organic emitting layer 155. Alternatively, to improve emission efficiency, the organic emitting layer 155 may have a multi-layered structure. For example, the organic emitting layer 155 may include a hole injecting layer, a hole transporting layer, an emitting material layer, an electron transporting layer and an electron injecting layer stacked on the first electrode 150 as an anode. The organic emitting layer 155 may be a quadruple-layered structure of the hole transporting layer, the emitting material layer, the electron transporting layer and an electron injecting layer or a triple-layered structure of the hole transporting layer, the emitting material layer and the electron transporting layer.

A second electrode 160 is formed on the organic emitting layer 155 and covers an entire surface of a display region of the first substrate 110. The second electrode 160 is formed of a metallic material having a relatively low work function, e.g., Al, Al alloy, silver (Ag), magnesium (Mg), gold (Au), or Al—Mg alloy (AlMg). The second electrode 160 serves as a cathode.

The first electrode 150, the organic emitting layer 155 and the second electrode 160 constitute the emitting diode E.

A seal pattern (not shown) of a sealant or a frit material is formed on edges of the first substrate 110 or the second substrate 170. The first and second substrates 110 and 170 are attached using the seal pattern. A space between the first and second substrates 110 and 170 has a vacuum condition or an inert gas condition. The second substrate 170 may be a flexible plastic substrate or a glass substrate.

Alternatively, the second substrate 170 may be a film contacting the second electrode 160. In this instance, the film-type second substrate is attached to the second electrode 160 by an adhesive layer.

In addition, an organic insulating film or an inorganic insulating film may be formed on the second electrode 160 as a capping layer. In this instance, the organic insulating film or the inorganic insulating film serves as the encapsulation film without the second substrate 170.

In the OLED display device 101 including the lower layer 153a of the bank 153, which has the thickness being smaller than the organic emitting layer 155 and has a hydrophobic property, and the upper layer 153b of the bank 153, which has the second width smaller than the first width of the lower layer 153a, the organic emitting layer 155 is formed on the lower layer 153a and the organic emitting material is concentrated into a center of the pixel region P by the lower layer 153a. As a result, a problem of an increase in the thickness of the organic emitting layer 155 is reduced in a region adjacent to the lower layer 153a.

In addition, since the organic emitting layer 155 on the lower layer 153a of the bank 153 has a portion forming a substantially flat top surface with the center of the pixel region P, the organic emitting layer 155 has a uniform thickness in a region surrounded by the lower layer 153a of the bank. As a result, an emission area EA2 is increased in comparison to the emission area EA1 of FIG. 1 in the prior art OLED display device such that the OLED display device of the present invention has the improved aperture ratio.

Moreover, since an area having thickness uniformity of the organic emitting layer 155 is increased, brightness uniformity of the OLED display device of the present invention is improved. Furthermore, due to the thickness uniformity of the organic emitting layer 155, a thermal degradation problem of the organic emitting layer is prevented such that the OLED display device has an improved lifetime.

Hereinafter, a method of fabricating the OLED display device is explained with reference to FIGS. 9A to 9G. FIGS. 9A to 9G are cross-sectional views showing a fabricating process of an OLED display device according to a first embodiment of the present invention. The explanation is focused on a bank having a double-layered structure with different widths.

As shown in FIG. 9A, on the first substrate 110, the gate line (not shown), the data line (not shown) and the power line (not shown) are formed. In addition, the switching TFT (not shown) connected to the gate and data lines and the driving TFT DTr connected to the switching TFT and the power line are formed.

As explained above, each of the switching TFT and the driving TFT DTr has a bottom gate type TFT including the gate electrode 115 of FIG. 4 or 213 of FIG. 5 as a lowest layer or a top gate type TFT including the semiconductor layer 313 of FIG. 6 as a lowest layer. The bottom gate type TFT includes the oxide semiconductor layer 120 of FIG. 4 or the amorphous silicon semiconductor layer 220 of FIG. 5 including the active layer 220a and the ohmic contact layer 220b, and the top gate type TFT includes the poly-silicon semiconductor layer 313 of FIG. 6.

Here, the switching TFT and the driving TFT DTr may be the bottom gate type TFT including an oxide semiconductor layer. Therefore, the gate electrode 115 of the driving TFT DTr is formed on the first substrate 110, the gate insulating layer 118 is formed on the gate electrode 115, and the oxide semiconductor layer 120 is formed on the gate insulating layer 118 corresponding to the gate electrode 115. The etch-stopper 122 is formed on the oxide semiconductor layer 120 and covers the center of the oxide semiconductor layer 120. The source and drain electrodes 133 and 136 are formed on the etch-stopper 122 and spaced apart from each other.

Next, an organic insulating material, e.g., photo-acryl, is coated over the switching TFT and the driving TFT DTr and is patterned to form the passivation layer 140 having a flat top surface and including the drain contact hole 143. The drain electrode 136 of the driving TFT DTr is exposed through the drain contact hole 143.

Next, a transparent conductive material, which has a relatively high work function, is deposited on the passivation layer 140 and patterned to form the first electrode 150. The first electrode 150 contacts the drain electrode 136 of the driving TFT DTr through the drain contact hole 143 and is separated in each pixel region P. For example, the transparent conductive material may be indium tin oxide (ITO).

Meanwhile, as explained above, the reflection layer (not shown), which includes Al or Al alloy, may be formed under the first electrode 150 and on the passivation layer 140. The reflection layer may be formed by the same mask process as the first electrode 150.

Figure 9B:
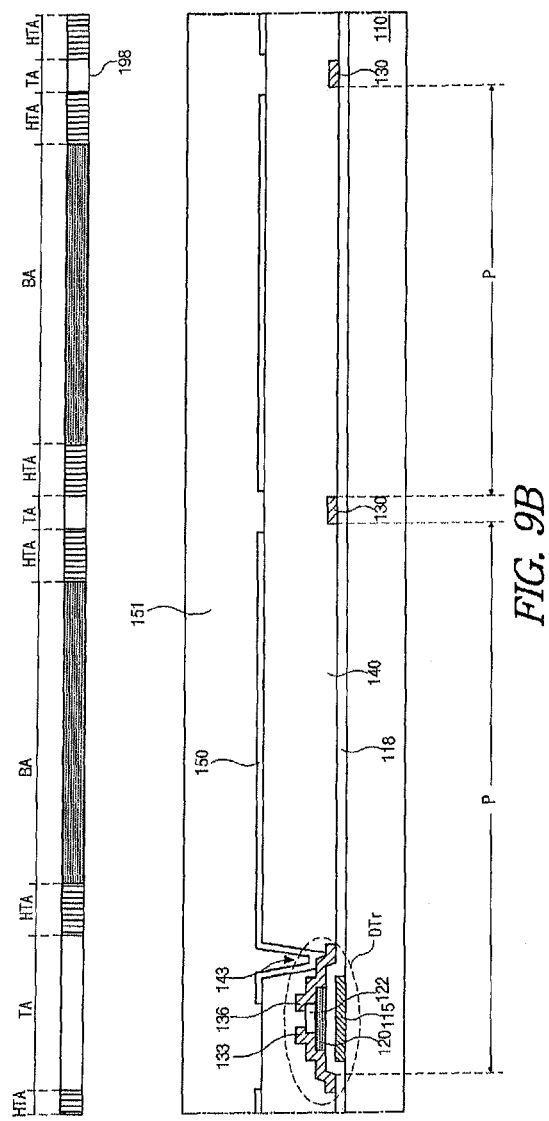

Next, as shown in FIG. 9B, a bank material layer 151 is formed on the first electrode 150 and the passivation layer 140. For example, the bank material layer 151 may be formed by coating a polymer material having a hydrophobic property. The polymer material may include at least one of polyimide containing fluorine (F), styrene, methylmethacrylate, and polytetrafluoroethylene. At this time, the polymer material may include a photosensitive material having a photosensitive property.

An exposing mask 198 including a transmitting region TA, a blocking region BA and a half-transmitting region HTA is disposed over the bank material layer 151, and an exposing process to the bank material layer 151 is performed using the exposing mask 198 without an additional photoresist layer.

Here, the bank material layer 151 is shown to have a negative type photosensitive property where an exposed portion of the bank material layer 151 remains after a developing process. Alternatively, the bank material layer 151 may have a positive type photosensitive property, and at this time, a position of the transmitting region TA and the blocking region BA is switched.

Next, as shown in FIG. 9C, the bank 153 including the lower layer 153a and the upper layer 153b is formed by developing the bank material layer 151 of FIG. 9B exposed to light. In this instance, an exposed portion of the bank material layer 151 of FIG. 9B corresponding to the transmitting region TA of the exposing mask 198 remains to form the upper layer 153b having the same thickness as the bank material layer 151 of FIG. 9B, a non-exposed portion of the bank material layer 151 corresponding to the blocking region BA of the exposing mask 198 is removed by the developing process, and a partially-exposed portion of the bank material layer 151 of FIG. 9B is partially removed to form the lower layer 153a having the thickness smaller than that of the upper layer 153b.

Accordingly, after the developing process, the bank 153 having the double-layered structure is formed in the edge of each pixel region P such that the upper layer 153b having the second width is disposed in a center of the edge of each pixel region P and the lower layer 153a having the first width larger than the second width is exposed outwards the side surfaces of the upper layer 153b. The exposed width of the lower layer 153a may be 1 micrometer to 9 micrometers, and the thickness of the lower layer 153a may be 0.2 micrometers to 1.5 micrometers.

Meanwhile, the bank material layer 151 of FIG. 9B may include a hydrophobic polymer material without a photosensitive property. This will be explained as another example of the first embodiment with reference to FIGS. 10A to 10F. FIGS. 10A to 10F are cross-sectional views showing a fabricating process of on OLED display device according to another example of the first embodiment of the present invention.

Figure 10A:
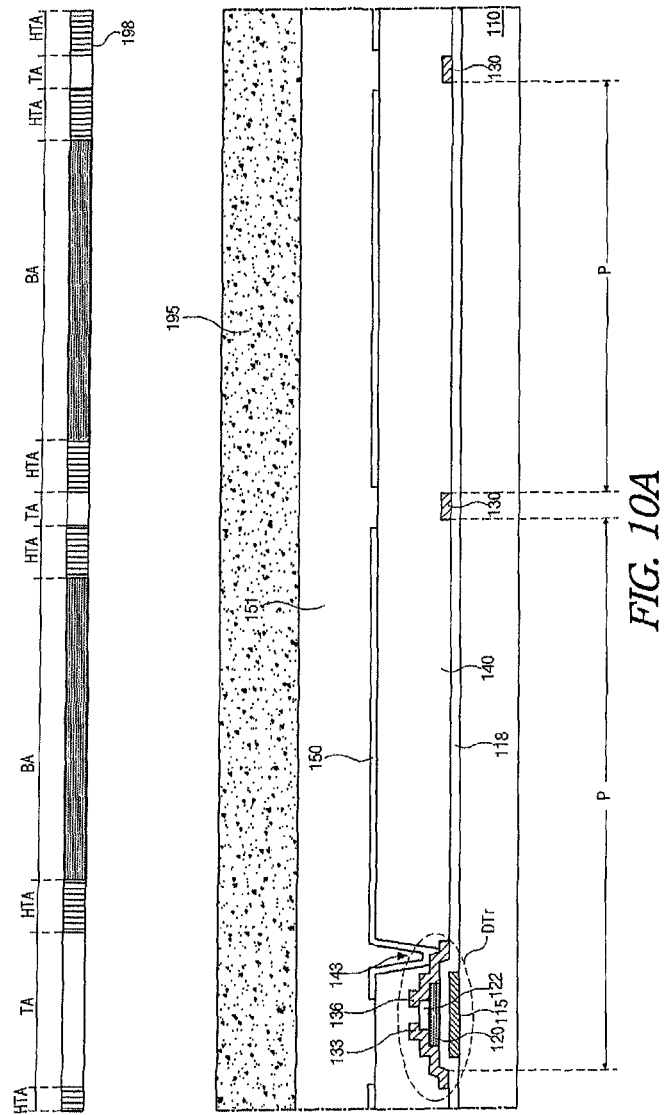

As shown in FIG. 10A, a bank material layer 151 is formed on the first electrode 150 all over the first substrate 110. The bank material layer 151 may be formed by coating a polymer material having a hydrophobic property without a photosensitive property.

Next, a photoresist layer 195 is formed on the bank material layer 151 by applying photoresist.

Then, an exposing mask 198 including a transmitting region TA, a blocking region BA and a half-transmitting region HTA is disposed over the photoresist layer 195, and an exposing process to the photoresist layer 195 is performed using the exposing mask 198.

Here, the photoresist layer 195 is shown to have a negative type photosensitive property where an exposed portion of the photoresist layer 195 remains after a developing process. The exposing mask 198 is disposed such that the transmitting region TA and the half-transmitting region HTA correspond to the edge of each pixel region P, and the blocking region BA corresponds to the center of the pixel region P.

Figure 10B:
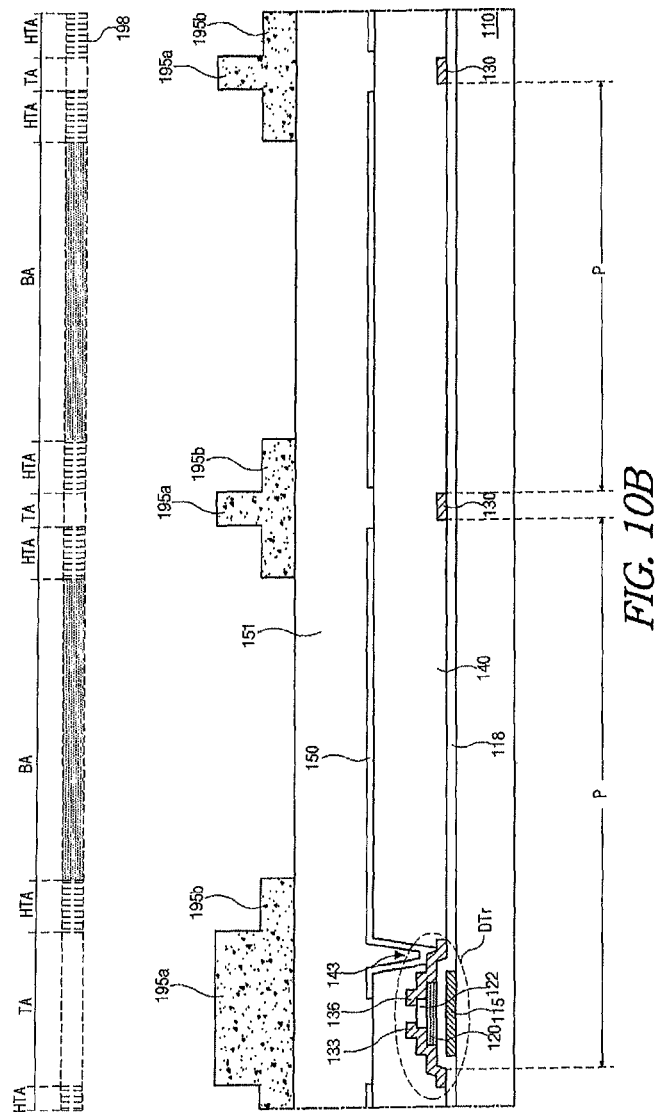

Next, as shown in FIG. 10B, a first photoresist pattern 195a and a second photoresist pattern 195b are formed by developing the photoresist layer 195 of FIG. 10A exposed to light through the exposing mask 198. In this instance, an exposed portion of the photoresist layer 195 of FIG. 10A corresponding to the transmitting region TA of the exposing mask 198 remains to form the first photoresist pattern 195a having a first thickness the same as the photoresist layer 195 of FIG. 10A, a non-exposed portion of the photoresist layer 195 of FIG. 10A corresponding to the blocking region BA of the exposing mask 198 is removed by the developing process, and a partially-exposed portion of the photoresist layer 195 of FIG. 10A is partially removed to form the second photoresist pattern 195b having a second thickness smaller than the first thickness.

Figure 10C:
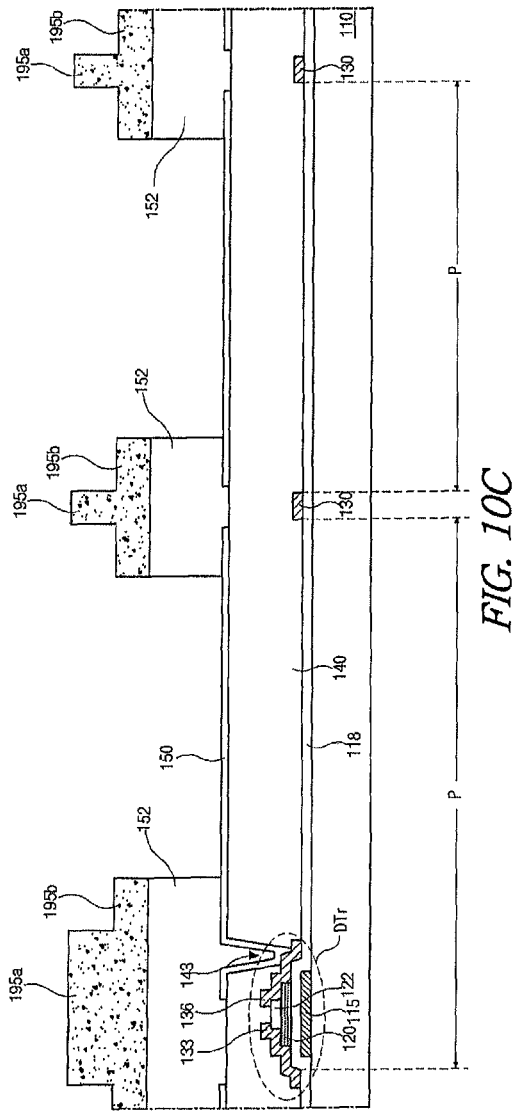

In FIG. 10C, a bank pattern 152 is formed under the first and second photoresist patterns 195a and 195b by removing the bank material layer 151 of FIG. 10B exposed by the first and second photoresist patterns 195a and 195b through an etching process. The bank pattern 152 is disposed in the edge of the pixel region P and has a uniform thickness.

Figure 10D:
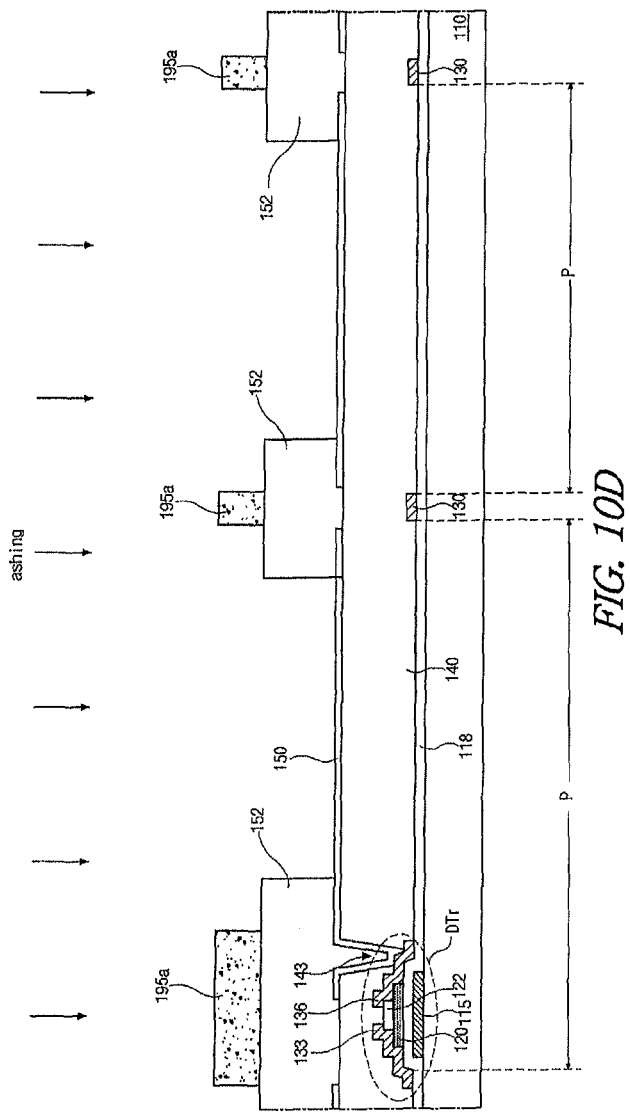

Next, in FIG. 10D, the second photoresist pattern 195b of FIG. 10C having the second thickness is removed by performing an aching process, and the bank pattern 152 is partially exposed outwards side surfaces of the first photoresist pattern 195a. Here, the first photoresist pattern 195a is also partially removed, so that the thickness of the first photoresist pattern 195a is reduced.

Figure 10E:
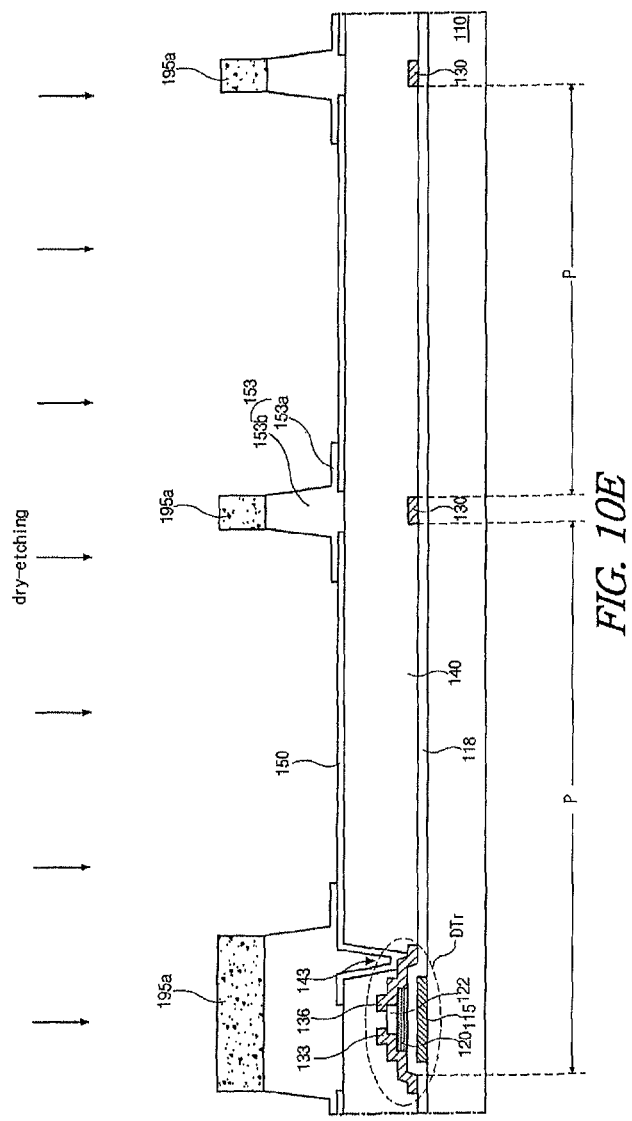

In FIG. 10E, the bank pattern 152 of FIG. 10D exposed by the first photoresist pattern 195a is dry-etched and partially removed to thereby form the lower layer 153a of the bank 153 such that the lower layer 153a of the bank 153 has a thickness of 0.2 micrometers to 1.5 micrometers. At the same time, a portion of the bank pattern 152 of FIG. 10D, which is disposed under the first photoresist pattern 195a and is not dry-etched, becomes the upper layer 153b of the bank 153.

Here, the width of the lower layer 153a of the bank 153 exposed outwards the side surfaces of the upper layer 153b of the bank 153 may be 1 micrometer to 9 micrometers.

Next, as shown in FIG. 10F, the first photoresist pattern 195a of FIG. 10E is removed by performing a stripping process, thereby completing the bank 153 of the double-layered structure having the different widths in another example of the first embodiment.

Figure 9D:
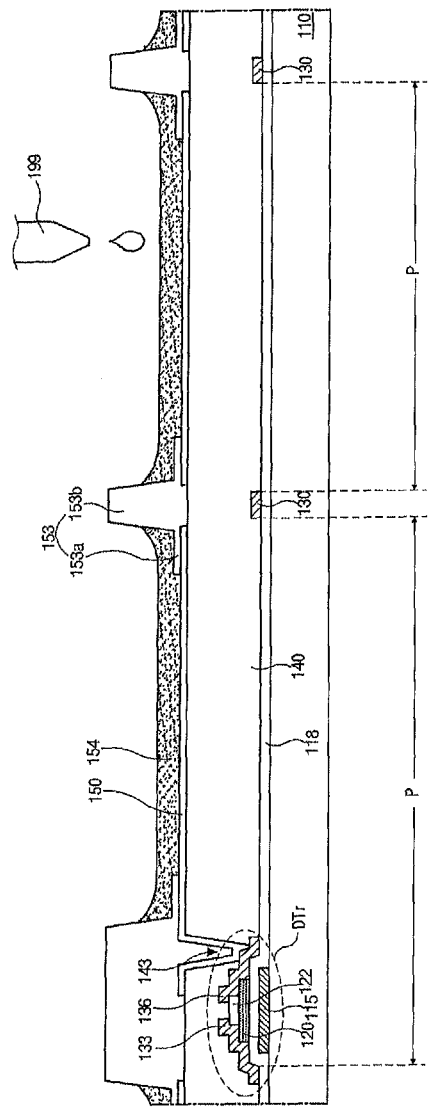

In the meantime, as shown in FIG. 9D, after forming the bank 153 having the double-layered structure, an organic emitting material layer 154 is formed on the first electrode 150 and the lower layer 153a of the bank 153 by spraying or dropping a liquid phase organic emitting material in a region surrounded by the upper layer 153b of the bank 153 with an ink jet apparatus or a nozzle-coating apparatus.

Even if the organic emitting material is sprayed or dropped on the upper layer 153b because of a mis-alignment of the ink-jet apparatus or the nozzle-coating apparatus, the organic emitting material is concentrated into a center of the pixel region P because the material of the upper layer 153b has a hydrophobic property. In addition, even if an excessive amount of the organic emitting material is sprayed or dropped, the organic emitting material does not flow over the upper layer 153b due to the hydrophobic property of the upper layer 153b.

Furthermore, since the lower layer 153a has a thickness smaller than the organic emitting material layer 154, the organic emitting material layer 154 is also formed on the lower layer 153a even though the lower layer 153a has a hydrophobic property.

Next, as shown in FIG. 9E, by performing a curing process, solvents and moisture in the organic emitting material layer 154 of FIG. 9D are removed such that the organic emitting layer 155 is formed in each pixel region P.

As mentioned above, since the organic emitting layer 155 has a uniform thickness in an entire surface of the effective pixel region SP of FIG. 8B, the OLED display device of the present invention has the improved aperture ratio. Namely, since the organic emitting layer 155 on a portion of the lower layer 153a has a flat top surface with the organic emitting layer 155 in a center of the pixel region P, the effective emission area EA2 of FIG. 8B is enlarged in comparison to the effective emission area EA1 of FIG. 8A of the prior art OLED display device.

Here, the organic emitting layer 155 has a single-layered structure. Alternatively, to improve emission efficiency, the organic emitting layer 155 may have a multi-layered structure. For example, the organic emitting layer 155 may include a hole injecting layer, a hole transporting layer, an emitting material layer, an electron transporting layer and an electron injecting layer stacked on the first electrode 150 as an anode. The organic emitting layer 155 may be a quadruple-layered structure of the hole transporting layer, the emitting material layer, the electron transporting layer and an electron injecting layer or a triple-layered structure of the hole transporting layer, the emitting material layer and the electron transporting layer.

Next, as shown in FIG. 9F, the second electrode 160 is formed on the organic emitting layer 155 by depositing a metallic material having a relatively low work function. The second electrode 160 is formed on an entire surface of a display region. The metallic material includes at least one of Al, Al alloy such as AlNd, Ag, Mg, Au and AlMg.

As explained above, the first electrode 150, the organic emitting layer 155 and the second electrode 160 constitute the emitting diode E.

Figure 9G:
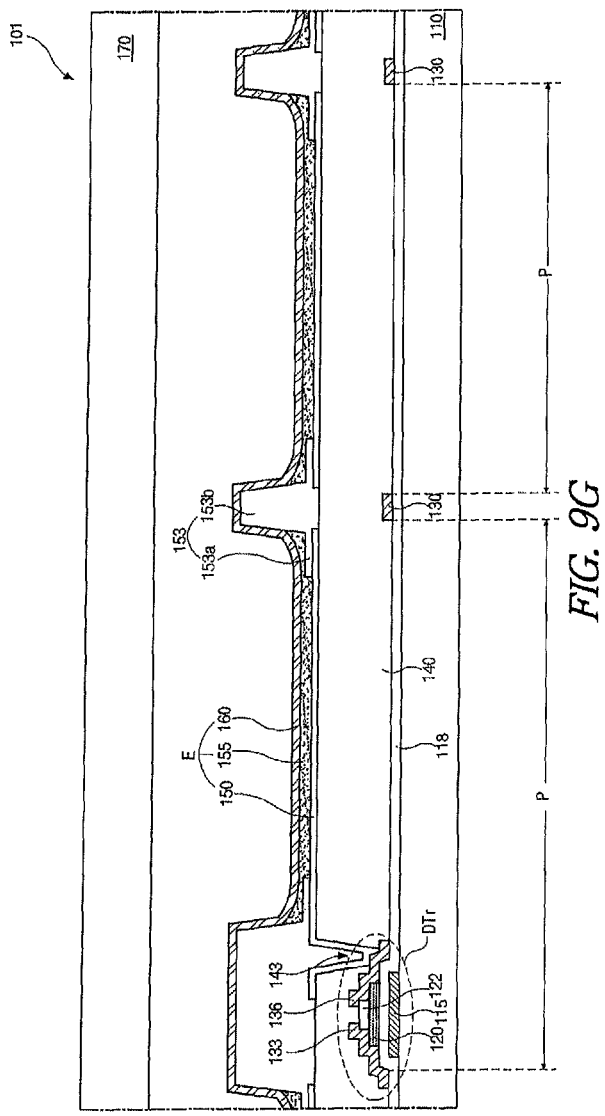

Next, as shown in FIG. 9G, after forming a seal pattern (not shown) on edges of the first substrate 110 or the second substrate 170, the first and second substrates 110 and 170 are attached under a vacuum condition or an inert gas condition such that the OLED display device is fabricated. Alternatively, a paste seal (not shown), which is formed of a frit material, an organic insulating material or a polymer material, having transparent and adhesive properties is formed over an entire surface of the first substrate 110, and then the first and second substrates 110 and 170 are attached. As explained above, instead of the second substrate 170, an inorganic insulating film or an organic insulating film may be used for an encapsulation.

FIGS. 11A to 11F are cross-sectional views showing a fabricating process of an OLED display device according to a second embodiment of the present invention. Since other steps except for a step of forming a bank in the second embodiment are the same as those in the first embodiment, the explanation is focused on a bank having a double-layered structure with different widths, and explanations for other steps are omitted.

Figure 11A:
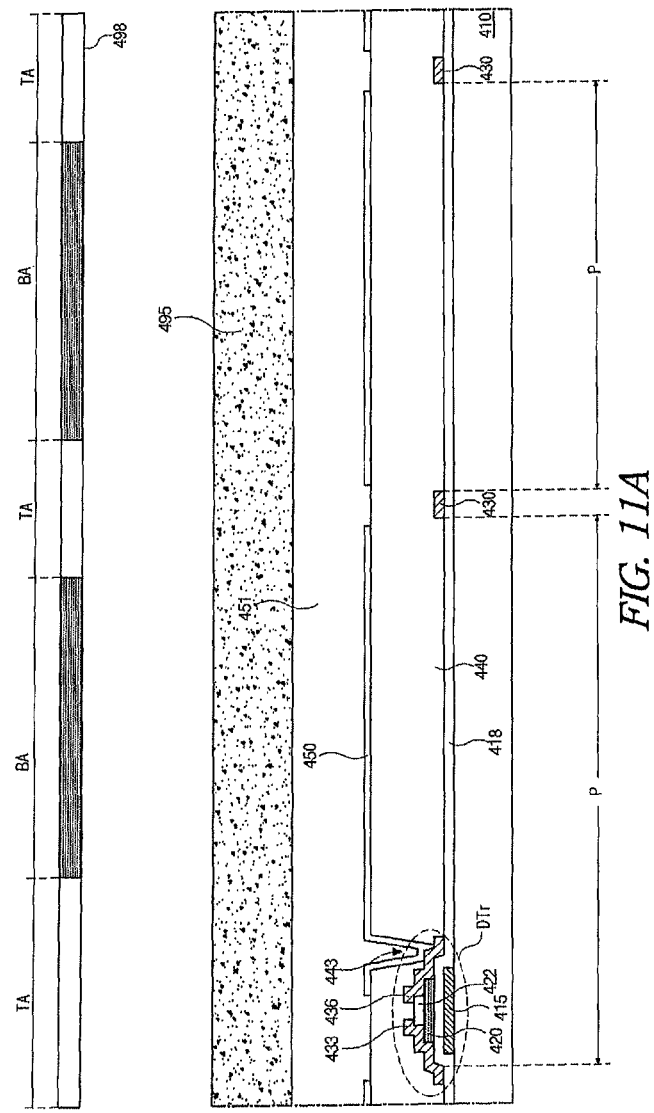
FIGS. 11A to 11F are cross-sectional views showing a fabricating process of an OLED display device according to a second embodiment of the present invention.

As shown in FIG. 11A, a switching TFT (not shown), a driving TFT DTr, a gate insulating layer 418, a gate line (not shown), a data line 430, a passivation layer 440, and a first electrode 450 are formed on a first substrate 410. A bank material layer 451 is formed on the first electrode 450 and the passivation layer 440. For example, the bank material layer 451 may be formed by coating a polymer material having a hydrophobic property without a photosensitive property. A photoresist layer 495 is formed on the bank material layer 451 by applying photoresist.

Next, an exposing mask 498 including a transmitting region TA and a blocking region BA is disposed over the photoresist layer 495, and an exposing process to the photoresist layer 495 is performed using the exposing mask 498.

Here, the photoresist layer 495 is shown to have a negative type photosensitive property where an exposed portion of the photoresist layer 495 remains after a developing process. The transmitting region TA corresponds to edges of a pixel region P, and the blocking region BA corresponds to a center of the pixel region P.

Figure 11B:
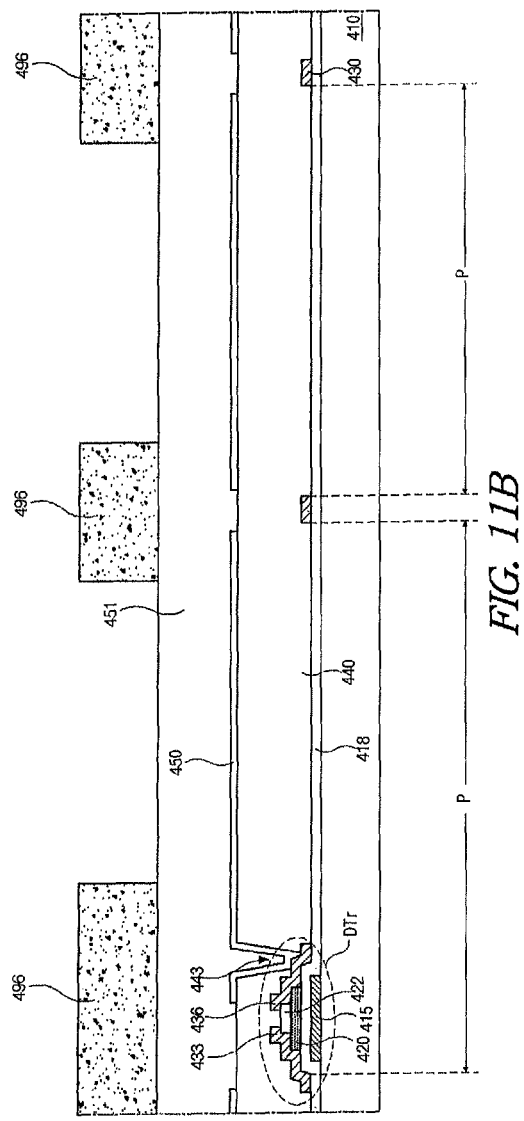

In FIG. 11B, a first photoresist pattern 496 is formed by developing the photoresist layer 495 of FIG. 11A exposed to light through the exposing mask 498. In this instance, an exposed portion of the photoresist layer 495 of FIG. 11A corresponding to the transmitting region TA of the exposing mask 498 of FIG. 11A remains to form the first photoresist pattern 496 having a first thickness the same as the photoresist layer 495 of FIG. 11A, and a non-exposed portion of the photoresist layer 495 of FIG. 11A corresponding to the blocking region BA of the exposing mask 498 of FIG. 11A is removed by the developing process.

Figure 11C:
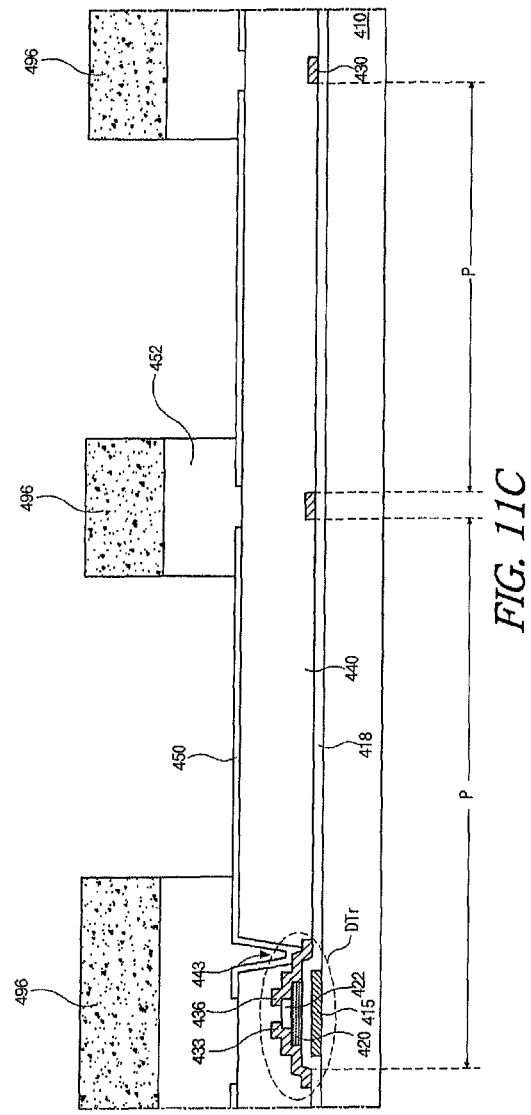

Next, in FIG. 11C, a bank pattern 452 is formed under the first photoresist pattern 496 and 496 by removing the bank material layer 451 of FIG. 11B exposed by the first photoresist pattern 496 through an etching process. The bank pattern 452 is disposed in the edge of the pixel region P and has a uniform thickness.

Figure 11D:
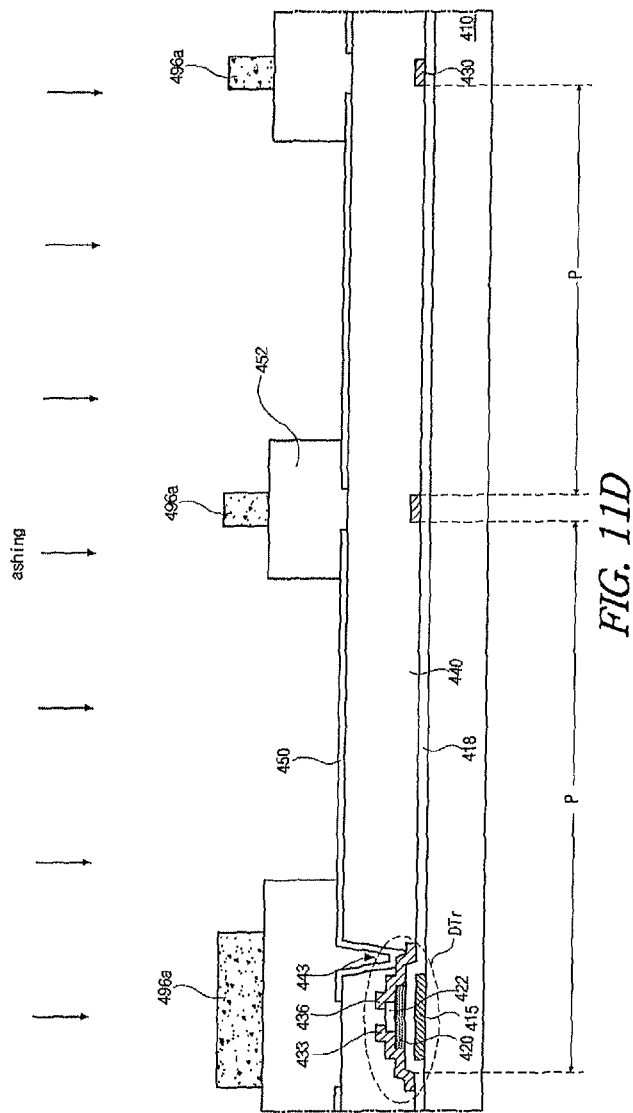

Next, in FIG. 11D, a second photoresist pattern 496a is formed by partially removing upper and side portions of the first photoresist pattern 496 of FIG. 11C having the uniform thickness through an isotropic ashing process, and the bank pattern 152 is exposed outwards side surfaces of the second photoresist pattern 496a. The second photoresist pattern 496a has a second thickness smaller than the first thickness of the first photoresist pattern 496 of FIG. 11C and a width smaller than that of the first photoresist pattern 496 of FIG. 11C.

The exposed portion of the bank pattern 452 may have a width of 1 micrometer to 9 micrometers, and the width of the exposed portion of the bank pattern 452 may be controlled by adjusting ashing time or flow rates of ashing gases.

Meanwhile, residues of the bank material layer 451 of FIG. 11B may remain after the etching process, and the residues may hinder a liquid phase organic emitting material from being spread because the bank material layer 451 of FIG. 11B has the hydrophobic property. However, in the second embodiment of the present invention, the residues of the bank material layer 451 of FIG. 11B can be completely removed through the isotropic ashing process, and the organic emitting material can be spread well when it is dropped.

Figure 11E:
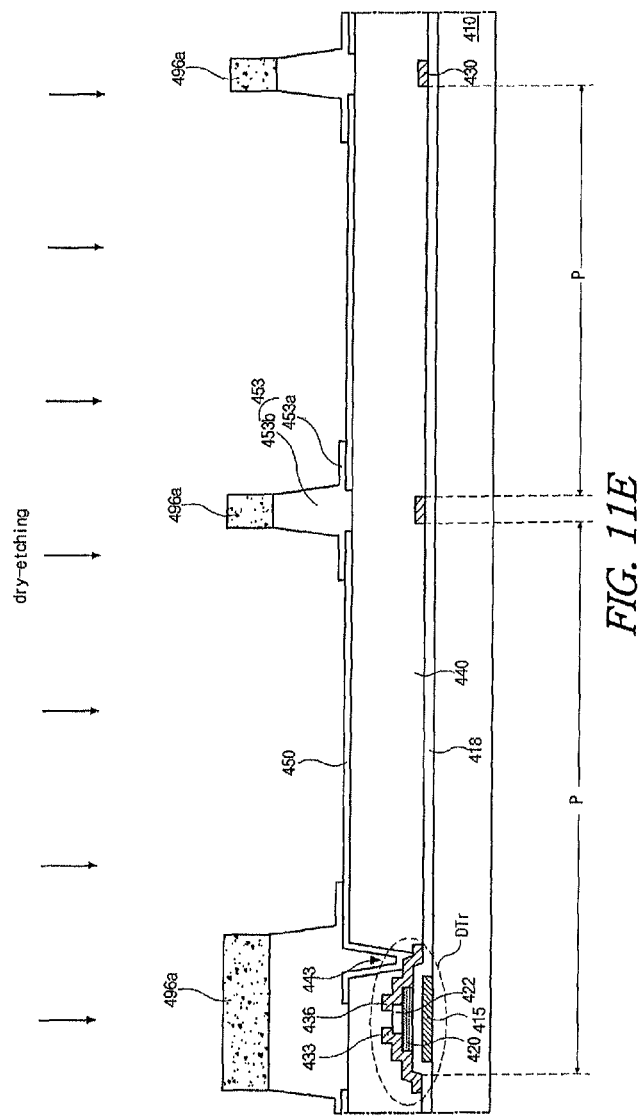

Next, in FIG. 11E, the bank pattern 452 of FIG. 11D exposed by the second photoresist pattern 496a is anisotropically dry-etched and partially removed using gases reacting with the bank pattern 452 of FIG. 11D to thereby form a lower layer 453a of a bank 453 such that the lower layer 453a of the bank 453 has a thickness of 0.2 micrometers to 1.5 micrometers. At the same time, a portion of the bank pattern 452 of FIG. 11D, which is disposed under the second photoresist pattern 296a and is not anisotropically dry-etched, becomes an upper layer 453b of the bank 453.

Figure 11F:
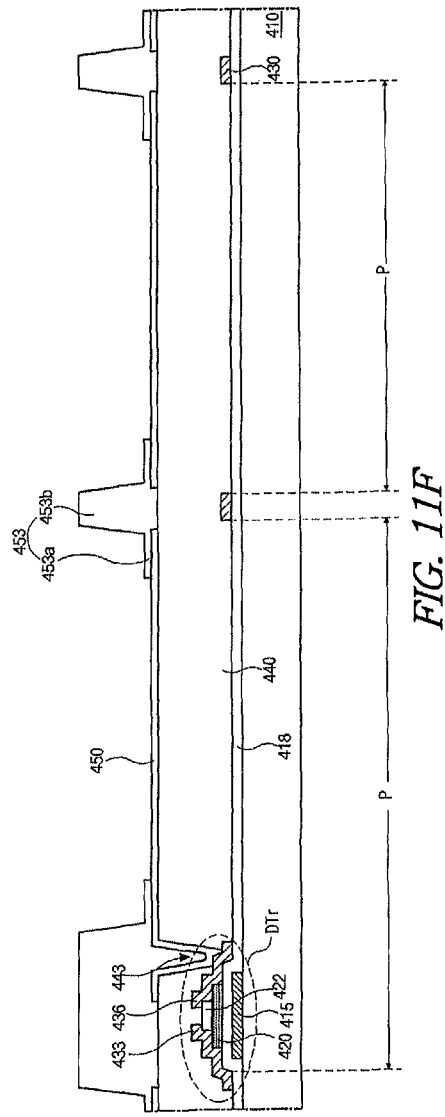

Then, as shown in FIG. 11F, the second photoresist pattern 496a of FIG. 11E is removed by performing a stripping process to thereby complete the bank 453 of a double-layered structure that includes the lower layer 453a and the upper layer 453b having the different widths. The width of the lower layer 453a of the bank 453 is within a range of 0.2 micrometers to 1.5 micrometers. The upper layer 453b of the bank 453 overlaps a center of the lower layer 453a of the bank 453.

Here, the width of the lower layer 453a of the bank 453 exposed outwards side surfaces of the upper layer 453b of the bank 453 may be 1 micrometer to 9 micrometers.

In the second embodiment of the present invention, the bank 453 including the lower layer 453a and the upper layer 453b of different widths is formed without use of an exposing mask, which includes a half-transmitting region and is relatively expensive. Therefore, the manufacturing costs are lowered.

Moreover, residues of the hydrophobic polymer material on the first electrode 450 can be completely removed during the ashing process of the first photoresist pattern, and thus the liquid phase organic emitting material can be spread well when the organic emitting layer is formed.

In the OLED display device of the invention, the effective emission area, where the organic emitting layer has a flat top surface, i.e., a uniform thickness, is increased due to the lower layer and the upper layer of the bank having different widths. As a result, the aperture ratio of the OLED display device is improved.

Furthermore, since an area of the organic emitting layer having the flat top surface increases in the pixel region, the brightness of the device is uniform, and display qualities are improved.

In addition, since the lower layer and the upper layer of the bank are formed in a single mask process, there are advantages in the production costs and the fabricating process.

Moreover, the uniformity in the thickness of the organic emitting layer is increased due to the lower layer of the bank, and the organic emitting layer is prevented from being degraded, thereby lengthening lifetime of the device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a substrate including a display region, wherein a plurality of pixel regions are defined in the display region;
   a first electrode over the substrate and in each of the plurality of pixel regions;
   a bank including a lower layer and an upper layer on the first electrode, the lower layer disposed on edges of the first electrode and having a first width and a first thickness, the upper layer disposed on the lower layer and having a second width smaller than the first width;
   an organic emitting layer directly on the first electrode and the lower layer without an intervening layer; and
   a second electrode on the organic emitting layer and covering an entire surface of the display region,
   wherein the lower layer and the upper layer consist of a same organic material having a hydrophobic property.

2. The device according to claim 1, wherein the organic emitting layer on the portion of the lower layer has a flat top surface with the organic emitting layer on a center of the pixel region.

3. The device according to claim 1, wherein the organic emitting layer in a region surrounded by the lower layer has a uniform thickness.

4. The device according to claim 1, wherein the organic emitting layer has a second thickness larger than the first thickness.

5. The device according to claim 4, wherein the first thickness has a range within about 0.2 to 1.5 micrometers.

6. The device according to claim 1, wherein the upper layer completely overlaps the lower layer such that the lower layer protrudes from the upper layer by a third width.

7. The device according to claim 6, wherein the third width has a range within about 1 to 9 micrometers.

8. The device according to claim 1, wherein the lower layer has a protruding edge from the upper layer, and the organic emitting layer contacts an entire upper surface of the protruding edge of the lower layer.

9. An organic light emitting diode display device, comprising:
   a substrate including a display region, wherein a plurality of pixel regions are defined in the display region;
   a first electrode over the substrate and in each of the plurality of pixel regions;
   a bank including a lower layer and an upper layer on the first electrode, the lower layer disposed on edges of the first electrode and having a first width and a first thickness, the upper layer disposed on the lower layer and having a second width smaller than the first width;
   an organic emitting layer on the first electrode and side and upper surfaces of a portion of the lower layer without an intervening layer; and
   a second electrode on the organic emitting layer and covering an entire surface of the display region,
   wherein the lower layer and the upper layer consist of a same organic material having a hydrophobic property, and
   wherein the organic emitting layer has a second thickness larger than the first thickness.

10. The device according to claim 9, wherein the organic emitting layer on the portion of the lower layer has a flat top surface with the organic emitting layer on a center of the pixel region.

11. The device according to claim 9, wherein the organic emitting layer in a region surrounded by the lower layer has a uniform thickness.

12. The device according to claim 9, wherein the first thickness has a range within about 0.2 to 1.5 micrometers.

13. The device according to claim 9, wherein the upper layer completely overlaps the lower layer such that the lower layer protrudes from the upper layer by a third width.

14. The device according to claim 13, wherein the third width has a range within about 1 to 9 micrometers.

\* \* \* \* \*